United States Patent [19]

Christen

[11] 4,410,810
[45] Oct. 18, 1983

[54] HIGH SPEED TRANSISTOR SWITCHING CIRCUIT

[75] Inventor: Roland W. Christen, Rockford, Ill.

[73] Assignee: Gould Inc., Rolling Meadows, Ill.

[21] Appl. No.: 290,504

[22] Filed: Aug. 6, 1981

[51] Int. Cl.³ .................... H03K 3/335; H03K 3/33
[52] U.S. Cl. ................................. 307/300; 307/254; 307/280; 307/311
[58] Field of Search ............... 307/300, 255, 280, 254, 307/314, 270

[56] References Cited

U.S. PATENT DOCUMENTS

| | | | |
|---|---|---|---|
| 3,852,620 | 12/1974 | Milberger et al. | 307/300 |
| 4,239,989 | 12/1980 | Brajder | 307/300 |
| 4,287,436 | 9/1981 | Tezuka et al. | 307/270 |
| 4,293,812 | 10/1981 | Kubach et al. | 307/270 |
| 4,318,011 | 3/1982 | Zeis | 307/255 |
| 4,322,785 | 3/1982 | Walker | 307/300 |
| 4,348,598 | 9/1982 | Smith | 307/300 |

Primary Examiner—Stanley D. Miller
Assistant Examiner—B. P. Davis
Attorney, Agent, or Firm—Kay H. Pierce; Edward E. Sachs

[57] ABSTRACT

A transistor switching circuit for switching a power transistor (28) from an on state to an off state at high speeds with minimal dissipation of power and without encountering secondary breakdown in the power transistor. The transistor switching circuit includes a transformer (36) having a secondary winding (35) connected to the base (30) of the power transistor (28) and a primary winding (49) connected to switching logic (38), the transformer (36) providing galvanic isolation between the power transistor (28) and the switching logic (38). The switching logic (38) includes a first switch (50) and a second switch (52). With the first switch (50) on and the second switch (52) off, the secondary winding (35) of the transformer (36) develops a positive base current applied to the power transistor (28) turning the transistor on. To initiate switching of the transistor (28) off, the first and second switches (50,52) are both on, causing the secondary winding (35) to cease conducting current to allow collector charge carriers of the transistor (28) to recombine. After the collector charge carriers have sufficiently recombined, as sensed by a saturation sensing circuit (62), the first switch (50) is turned off, the second switch (52) remaining on so that the secondary winding (35) develops a negative current applied to the base of the power transistor (28), turning the transistor (28) off rapidly. The transistor switching circuit further includes means to limit the maximum base-emitter voltage of the transistor and means to reset the transformer core rapidly.

21 Claims, 5 Drawing Figures

HIGH SPEED TRANSISTOR SWITCHING CIRCUIT

BACKGROUND OF THE INVENTION

1. Field of the Invention

This invention relates to a high speed transistor switching circuit which prevents secondary breakdown in a power transistor and provides galvanic isolation between the transistor switching logic and the transistor itself.

2. Description of the Background Art

Power transistors have been used extensively to switch high voltages and currents. Little, if any, stress is placed on a transistor when switched from an off state to an on state by the application of base current causing the transistor to conduct load current. However, when a transistor, conducting high load currents during the on state, is switched to the off state, secondary breakdown in the transistor can occur. To switch the transistor off, the base current is reversed in polarity to sweep out charge carries from the base region of the transistor. After the base current reverses polarity, the base-emitter junction becomes increasingly negatively charged, causing focusing of all the collector current into a narrow ribbon in the center of the emitter active area. The focusing of the collector current in the emitter active area causes a secondary breakdown in the power transistor.

Known snubber circuits have been employed to momentarily bypass the load current when the transistor is switched from on to off states in order to prevent secondary breakdown in the transistor. Such snubber circuits typically include a parallel combination of a diode and a resistor connected in series with a capacitor across the collector and emitter of the power transistor. When the base current reverses polarity, the external snubber circuit will bypass some of the load current so that the overall collector current is safely below the breakdown rating of the transistor.

These known snubber circuits have a number of disadvantages. When switching of the transistor from the on to the off states occurs, the snubber circuit dissipates power and at high switching frequencies, this circuit consumes a large portion of the available power. Further, when used in conjunction with transistors in a bridge circuit, the snubber circuit associated with one transistor will cause large current transients to be produced in the complementary transistor of the bridge. In order to prevent transistor failure due to the large current transient caused by the snubber circuits, additional circuitry such as chokes and voltage clamps is required. The additional circuitry required is expensive, bulky in size and often results in additional problems.

SUMMARY OF THE INVENTION

In accordance with the present invention, the disadvantages of prior transistor switching circuits have been overcome.

The transistor switching circuit of the present invention allows a power transistor to be switched from the on to the off states at high speeds with minimal dissipation of power and without encountering secondary breakdown in the power transistor.

The high speed transistor switching circuit includes a transformer having a secondary winding connected to the power transistor and a primary winding connected to switching logic circuitry. The transformer provides galvanic isolation between the transistor switching logic and the transistor itself so that the output potentials will not affect the switching logic. Further, the transformer may be wound as a current step up transformer so that high secondary currents can be generated with minimal current stress on the circuit elements on the primary side of the transformer.

The power supply for the transformer includes an inductor connected to the primary winding of the transformer. The current stored in the inductor is used to turn the power transistor on and off under the control of the switching logic.

The switching logic includes a first transistor and a second transistor connected to the primary winding of the transformer to set up currents flowing through the secondary winding of the transformer in different directions depending upon the on/off state of each of these transistors. When the first transistor is on and the second transistor is off, the secondary winding of the transformer provides a positive base current to the power transistor, turning the power transistor on. To initiate the switching of the power transistor from the on state to the off state, both the first and second transistors are turned on, causing the secondary winding of the transformer to cease conducting. This allows the collector charge carriers to recombine before the application of a negative base current to the power transistor to prevent secondary breakdown of the transistor. After the collector charge carriers have sufficiently recombined, the first transistor is turned off, the second transistor remaining on. The direction of current flow through the secondary winding reverses, causing a negative base current to be applied to the power transistor, rapidly turning the power transistor off.

A diode connected in the power supply across the inductor provides a freewheeling path for the current which limits the negative base-emitter voltage to an allowable value when the direction of current reverses in the secondary winding to prevent reverse bias secondary breakdown in the power transistor.

A saturation sensing circuit is further provided to determine when the collector charge carriers have sufficiently recombined by monitoring the collector voltage of the power transistor. This circuit monitors the saturation condition of the power transistor and if the transistor comes out of saturation due to a severe overload, the saturation sensing circuit will cause the power transistor to be turned off immediately. Thus, the saturation sensing circuit acts as an overload limiter.

The high speed transistor switching circuit also includes means to generate a high voltage pulse to reset the transformer core rapidly, allowing a DC current to be drawn from the secondary winding of the transformer with very short discontinuities therein.

BRIEF DESCRIPTION OF THE DRAWING

Further advantages of the invention will be readily apparent from the following specification and from the drawings in which.

DESCRIPTION OF THE PREFERRED EMBODIMENT

Figure 1:
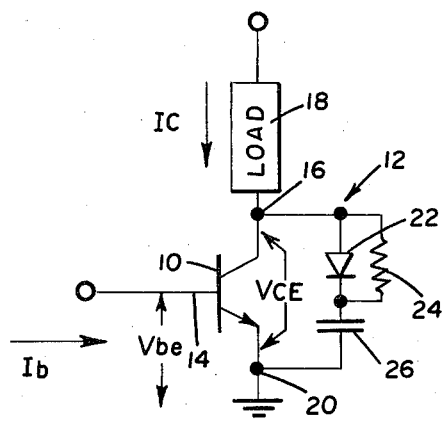
FIG. 1 is a schematic diagram of a prior art snubber circuit used with a power transistor.
Figure 2:
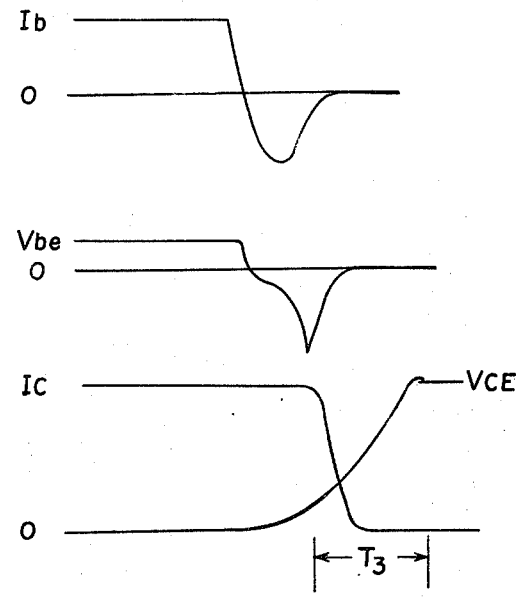
FIG. 2 is a graphical illustration of the current and voltage waveforms of the power transistor shown in FIG. 1.

A power transistor 10 is illustrated in FIG. 1 with a well-known snubber circuit generally designated 12. The transistor 10 has a base 14, a collector 16 connected to a load 18 and an emitter 20 connected to ground. The snubber circuit 12 includes a parallel combination of a diode 22 and a resistor 24 connected in series with a capacitor 26 across the collector and emitter of the power transistor 10. The transistor 10 turns on and begins to conduct a load current when a current, $I_b$, is applied to the base 14. In order to turn the transistor 10 off, the base current, $I_b$, is reversed in polarity, sweeping out the base charge carriers. As illustrated by the waveforms shown in FIG. 2, after the base current, $I_b$, reverses polarity, the base-emitter voltage, $V_{be}$, becomes increasingly negative whereas the collector current $I_C$ remains high. This results in the collector current focusing into a narrow ribbon in the center of the emitter active area causing secondary breakdown in the transistor. The snubber circuit 12 prevents secondary breakdown in the transistor 10 by bypassing some of the load current so that the overall collector current is safely below the breakdown rating of the transistor.

Although the snubber circuit 12 does prevent secondary breakdown in the power transistor 10, at high frequencies and high power levels, the snubber circuit consumes a large portion of the available power. Further, when used in conjunction with transistors in a bridge circuit, the snubber circuit 12 associated with one transistor will cause large current transients to be produced in the complementary transistor of the bridge.

Figure 3:
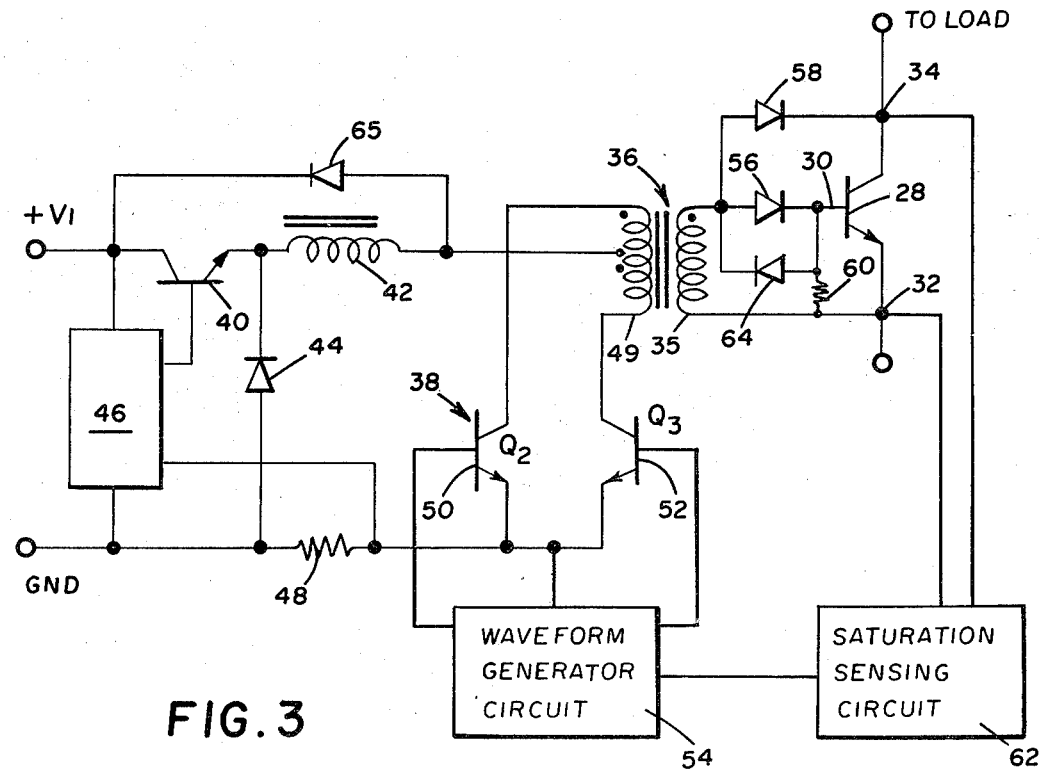
FIG. 3 is a schematic diagram of the high speed transistor switching circuit of the present invention.

The transistor switching circuit of the present invention as illustrated in FIG. 3, allows a power transistor 28 to be switched from on to off states at high speeds with a minimal dissipation of power and without encountering secondary breakdown in the transistor. The transistor 28 has a base 30, an emitter 32 and a collector 34, the collector being connected to a load which may be inductive as is often used in high current circuits. The transistor 28 is turned on to conduct load current, by the application of base current supplied by a secondary winding 35 of a transformer 36.

The transformer 36 provides galvanic isolation between the transistor 28 and the transistor switching logic, generally designated 38, which is on the primary side of the transformer. Because the switching logic 38 is electrically isolated from the output of the transistor 28, the output potentials will not affect the logic. Further, if the transformer 36 is configured as a current step-up transformer, high secondary currents can be generated with minimal current stress on the elements on the primary side of the transformer.

The power supply for the transformer 36 includes a transistor 40, an inductor 42 and a diode 44 which are driven by an intergrated circuit regulator 46 configured as a current regulator. The integrated circuit regulator supplies current to the base of the transistor 40, having its collector connected to +V1 and its emitter connected to the inductor 42. Current is sensed by a resistor 48, and is regulated by the intergrated circuit regulator to provide a constant predetermined value of current to the transformer 36 through the inductor 42 which is connected to the center of the primary winding 49.

Figure 4:
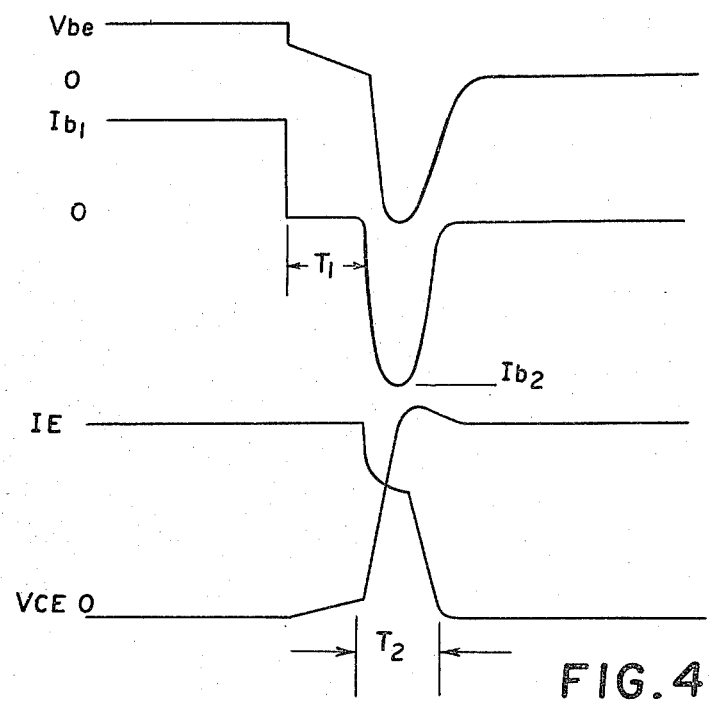
FIG. 4 is a graphical illustration of the current and voltage waveforms of the power transistor shown in FIG. 3.

The switching logic 38 includes a transistor 50 and a transistor 52, each having collectors connected to opposite sides of the primary winding 49 of the transformer 36 and having emitters connected to ground. The transistors 50 and 52 are turned on and off by waveforms applied to their respective bases from a waveform generator circuit 54. Depending upon the ON-OFF states of the transistors 50 and 52, the currents flowing through the primary winding 49 of the transformer will set up currents flowing through the secondary winding 35 in different directions or will cause the secondary winding to cease conducting in order to turn the transistor 28 on and off. The transformer 36 is thus controlled by the transistors 50 and 52 to provide a drive or base current $I_{b1}$ having a modified waveform as shown in FIG. 4, different from the base current waveform $I_b$ shown in FIG. 2 for the prior art.

The power transistor 28 is turned on when the transistor 50 is on and the transistor 52 is off. When current is applied to the base of the transistor 50 from the waveform generator 54, current stored in the inductor 42 flows through the primary winding 36 to ground through the transistor 50. This current flowing through the primary winding 49 sets up a positive current in the secondary winding 35 of the transformer 36 which flows through a diode 56 to the base of the transistor 28, turning the transistor on so that it begins to conduct load current.

The amount of positive base current injected into the transistor 28 from the secondary winding 35 of the transformer 36 is determined by the amount of load current. With light loads, the transistor requires very little base current to saturate, and any excess current from the secondary winding 35 is automatically bypassed or shunted through a diode 58 into the collector 34 of the transistor 28. With high load currents being present, the collector saturation voltage increases, causing the diode 58 to conduct less current and forcing more drive current into the base 30 of the transistor 28. The diodes 58 and 56 prevent the transistor from going into hard saturation so that excess charge carriers will not build up in the base region of the transistor 28.

To initiate the switching of the power transistor 28 from the on to the off states, the transistor 50 remains on and the transistor 52 is turned on by the application of base current from the waveform generator 54. The current stored in the inductor 42 now flows through the primary winding 49 to ground through both of the transistors 50 and 52. The currents flowing through the primary winding 49 with both transistors 50 and 52 on, cause the secondary winding 35 to cease conducting. When the secondary winding 35 ceases conducting, some of the base charge begins flowing through a resistor 60 to ground which allows the collector region of the transistor to recover. During this time the collector charge carriers recombine to prevent current focusing at the emitter.

As seen from FIG. 4, when the base current $I_{b1}$ goes to zero, the base-emitter voltage $V_{be}$ decreases to zero and the collector voltage $V_{CE}$ begins to rise. When the collector charge carriers have sufficiently recombined after a period of time, $T_1$, the transistor 28 is in a linear region and may be switched off very rapidly. The time period $T_1$, during which the collector charge carriers are allowed to recombine, may be either a set period of time or a time period as determined by a saturation sensing circuit 62.

The saturation sensing circuit 62 determines when the collector charge carriers have sufficiently recombined by monitoring the collector voltage, $V_{CE}$. When the collector voltage, $V_{CE}$, has reached a point of quasi-saturation of approximately 10–12 volts, the saturation sensing circuit 62 provides a signal to the waveform generator circuit 54 to turn the transistor 50 off while the transistor 52 remains on. With the transistor 52 on and the transistor 50 off, a current is set up in the secondary winding of the transformer 36 which flows in the reverse direction so that a negative base current is applied to the transistor 28, removing the remaining charge from the base 30 of the transistor 28 through a diode 64 and turning the transistor 28 off. As seen from FIG. 4, when the polarity of the base current $I_b$ reverses, the collector voltage rapidly increases and the transistor 28 is turned off after a time $T_2$ which is much shorter than the time $T_3$ as shown for the prior art in FIG. 2. Thus the transistor 28 is rapidly turned off with minimal power dissipation.

Also as seen from FIG. 4, as the base charge is depleted, the base-emitter resistance rises, causing a negative voltage to build up at the base-emitter junction. In order to prevent reverse breakdown of the base-emitter region of the transistor, the negative base-emitter voltage must be limited. A diode 65, connected across the transistor 40 and the inductor 42 of the power supply, bypasses the current produced by the inductor 42 when the reflected secondary voltage equals $+V_1$, allowing the current in the inductor 42 to freewheel through the diode 65 and the transistor 40. The freewheeling path provided by the diode 65 limits the maximum base-emitter voltage to an allowable value. Further, as the current freewheels through the diode 65 and the transistor 40, the voltage $+V_1$ is impressed across the transformer 36 in such a way as to reset the transformer core flux so that the circuit will be ready for the next turn-on cycle.

Figure 5:
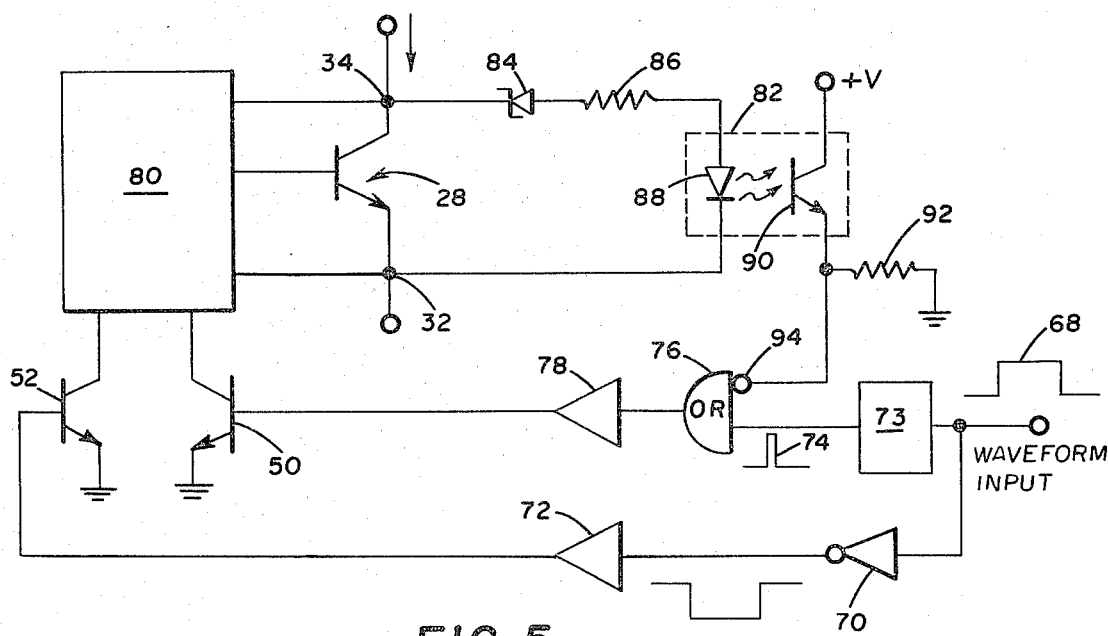
FIG. 5 is a schematic illustration of the saturation sensing circuit of FIG. 3.

The saturation sensing circuit 62 is shown in greater detail in FIG. 5. This circuit senses the saturation level of the transistor 28 by monitoring the collector voltage, $V_{CE}$. If the transistor 28 comes out of saturation for any reason a pulse of negative current is generated and injected into the base of the transistor 28 to rapidly switch the transistor off as discussed above.

To switch the transistor 28 on, the waveform generator circuit 54 produces a high signal 68, which when applied to an inverter 70 produces a low signal so that the transistor 52 connected to the inverter 70 through a buffer amplifier 72 remains off. The high signal 68 is also applied to a one shot multi-vibrator 73 to produce a pulse 74, the duration of which is sufficient to allow the transistor 28 to saturate before the termination thereof. The pulse 74 is input to an OR gate 76 connected to the base of the transistor 50 through a buffer amplifier 78, the pulse 74 turning the transistor 50 on. When the transistor 50 is on and the transistor 52 is off, the transistor driving circuit 80 shown in block diagram form, generates a positive polarity base current to turn the power transistor 28 on, as discussed above.

The transistor 28 quickly saturates with the application of base current. The saturation condition of the transistor 28 is sensed by an opto-coupler 82 connected to the collector 34 of the transistor 28 through a zener diode 84 connected in series with a resistor 86. The opto-coupler includes a light emitting diode 88 which actuates a photo sensitive transistor 90 connected to ground through a resistor 92. When the transistor 28 saturates, the output of the opto-coupler 82 is zero, which when input to an inverting input terminal 94 of the OR gate 70, causes the output of the OR gate to go high. The high signal from the OR gate 70 maintains the transistor 28 on after the pulse 74 ceases if the transistor 28 saturates before the termination of the pulse. If transistor 28 does not saturate due to an excess load current or short circuit, the output of the OR gate 70 will go low after the termination of pulse 74, turning off the transistor 50 and the transistor 28 to prevent its destruction.

When the transistor 28 is to be turned off, the signal 68 from the waveform generator goes low and when applied to the inverter 70 produces a high signal turning on the transistor 52. During this time the transistor 50 remains on due to the latching function of the OR gate 70 when the transistor 28 is saturated. When both transistors 50 and 52 are on, the base current from the driving circuit 80 goes to zero as discussed above.

With zero base current, the collector voltage, $V_{CE}$, of the transistor 28 begins to rise. When the collector voltage reaches approximately 10–12 volts, which is the breakdown voltage of the zener diode 84, the zener diode 84 begins conducting through the resistor 86 and the opto-coupler 82. The photo sensitive transistor begins conducting and produces a high signal applied to the inverting input terminal 94, causing the output of the OR gate 76 to go low. The low output of the OR gate 70 turns the transistor 50 off. As discussed above, when the transistor 50 is off and the transistor 52 is on, the transistor driving circuit 80 produces a negative base current which, when applied to transistor 28, quickly turns the transistor off.

If during the normal on-time of the transistor 28, a severe overload such as a short circuit occurs, the transistor 28 will come out of saturation and as sensed by the saturation sensing circuit 62 will turn the transistor 50 off and the transistor 52 on so that a negative pulse is applied to the base of the transistor 28 to terminate conduction thereof. Thus the saturation sensing circuit also acts as an overload limiter, protecting the circuit from destruction by excessive load currents.

The transistor switching circuit shown in FIG. 3 may be modified so that the transformer 36 can be used to develop DC currents supplied to the transistor 28 with short discontinuities therein. This modification includes replacing the diodes 65 and 64 with silicon controlled rectifiers (SCRs) 65' and 64' each having a gating input supplied by the waveform generator 54. If the SCRs 65' and 64' are turned off during the time the transistor 28 is turned on, the freewheeling path previously provided by the diode 65 will be eliminated and the inductor 42 will generate a high voltage spike which will reset the core of the transformer 36 very rapidly. The SCR 64' is turned off during this time so that the reset pulse will have no effect on the transistor 28.

The reset time of the transformer and the duration of the high voltage spike generated by the inductor 42 are very short compared to the conduction time of the transistor 28. The reset pulse will not affect the saturation of the transistor 28 since the charge stored in the base region of the transistor 28 will carry the transistor through during the short reset time of the transformer. Thus the transformer 36 can be used to develop DC currents supplied to the transistor 28 with short discontinuities during the transformer core reset time. Continuous load currents are then possible. When the transistor 28 is to be turned off, the SCRs 64' and 65' are energized by a gating input supplied by the waveform generator circuit 54 and when gated, will act as ordinary diodes functioning as described above.

The foregoing disclosure of specific embodiments is illustrative of the broad invention concepts comprehended by the invention.

I claim:

1. A switching circuit for turning a power transistor on and off, the transistor having a base, a collector, and an emitter, said switching circuit comprising:
   drive means connected to the base of the transistor for providing a positive current to the transistor to turn the transistor on, and for providing a negative current to the transistor to turn the transistor off;
   means for sensing the saturation level of the transistor to provide a signal when the transistor reaches a level of guasi-saturation; and
   logic means connected to the drive means and having a first state for controlling the drive means to provide a positive current to the transistor to turn the transistor on, the logic means having a second state for controlling the drive means to cease providing current to the transistor to initiate the switching of the transistor off, and the logic means having a third state initiated in response to the quasi-saturation signal from the sensing means, for controlling the drive means to provide a negative current to the transistor when the transistor is in a linear region to turn the transistor off rapidly.

2. The transistor switching circuit of claim 1 further including means connected between the drive means and the base of the transistor for preventing excess charge carriers from building up in the base region of the transistor when the transistor is turned on.

3. The transistor switching circuit of claim 1 further including means for limiting the maximum negative base emitter voltage of the transistor when the logic means is in the third state.

4. The transistor switching circuit of claim 1 wherein the drive means includes means for electrically isolating the transistor from the logic means.

5. A switching circuit for turning a power transistor on and off, the transistor having a base, a collector, and an emitter, said switching circuit comprising:
   transformer means having a primary winding having first and second paths through which currents flow and having a secondary winding;
   means for connecting the secondary winding to the base of the transistor, the secondary winding being responsive to the flow of current through the primary winding for conducting current in a first direction to turn the transistor on and for conducting current in a second direction for turning the transistor off; and
   logic means connected to the primary winding of the transformer means for directing the flow of current through the first path of the primary winding to cause the secondary winding to conduct current in the first direction turning the transistor on, the logic means directing the flow of current through the second path to cause the secondary winding to conduct current in the second direction turning the transistor off, the logic means directs current through the first and second paths of the primary winding for a period of time sufficient for the transistor to reach a condition of quasi-saturation to cease the conduction of current in the secondary winding prior to directing the flow of current through only the secondary path of the primary winding.

6. The transistor switching circuit of claim 5 wherein the transformer means includes a core and the switching circuit further includes means for applying a high voltage pulse to the transformer means for resetting the transformer core.

7. The transistor switching circuit of claim 6 wherein the duration of the high voltage pulse is short for resetting the transformer core rapidly, the secondary winding developing a DC current with short discontinuities therein to be applied to the base of the transistor.

8. The transistor switching circuit of claim 5 further including an inductor means for storing current to be supplied to the primary winding of the transformer means for turning the transistor on and off.

9. The transistor switching circuit of claim 5 wherein the transformer means is a current step-up transformer.

10. A switching circuit for turning a power transistor on and off, the power transistor having a base, a collector, and an emitter, said switching circuit comprising:
    first switch means having an on state and an off state;
    second switch means having an on state and an off state; drive means for driving the transistor; and
    means for connecting the drive means to the base of the power transistor for conducting current to the power transistor, said drive means being responsive to the first and second switch means for providing a positive current to the power transistor turning the power transistor on with the first switch means in the on state and the second switch means in the off state, the drive means ceasing to conduct current to the power transistor with the first switch means in the on state and the second switch means in the on state to initiate the switching of the power transistor off to allow the transistor to achieve a state of quasi-saturation, and the drive means providing a negative current to the power transistor when the transistor achieves a state of quasi-saturation with the first switch means in the off state and the second switch means in the on state.

11. The transistor switching circuit of claim 10 wherein the drive means includes a transformer having a secondary winding connected to the base of the power transistor and having a primary winding connected to the first and the second switch means, the transformer providing galvanic isolation between the power transistor and the first and second switch means.

12. The transistor switching circuit of claim 11 further including an inductor means for storing current to be supplied to the primary winding of the transformer.

13. The transistor switching circuit of claim 12 further including means connected across the inductor means for providing a freewheeling path for the current stored in the inductor means when the voltage across the secondary winding of the transformer means reaches a preset value.

14. The transistor switching circuit of claim 12 wherein the inductor means produces a high voltage pulse to reset the transformer for developing a DC current in the secondary winding of the transformer to be applied to the base of the power transistor.

15. The transistor switching circuit of claim 14 further including gate means connected across the inductor means and being turned off when the power transistor is turned on for causing the inductor means to generate the high voltage reset pulse, the gate means being turned on when the power transformer is to be turned off, the gate means, when turned on, providing a free-wheeling path for the current stored in the inductor.

16. The transistor switching circuit of claim 11 wherein each of the first and second switch means includes a switching transistor having a collector connected to opposite ends of the primary winding.

17. The transistor switching circuit of claim 10 wherein the drive means further includes means for controlling the on-off states of the first and second switch means.

18. The transistor switching circuit of claim 17 wherein the control means includes a saturation sensing circuit for monitoring the saturation level of the power transistor and operative to turn the first switch means off in response to the power transistor coming out of saturation.

19. The transistor switching circuit of claim 18 wherein the saturation circuit includes means for monitoring the collector-emitter voltage of the power transistor to determine the saturation level.

20. A switching circuit for turning a power transistor on and off, the power transistor having a base, a collector, and an emitter, said switching circuit comprising:
   drive means;
   means connecting the drive means to the base of the transistor for alternatively conducting a positive current to be applied to the transistor for turning the transistor on and for conducting a negative current to be applied to the transistor for turning the transistor off;
   means for sensing the saturation level of the power transistor; and
   logic means responsive to the saturation level sensing means for controling the drive means to cease conducting current until the power transistor reaches a level of quasi-saturation as determined by the saturation sensing means prior to turning off the power transistor by the application of negative current.

21. The transistor switching circuit of claim 20 wherein the means for sensing the saturation level of the power transistor includes means for monitoring the collector-emitter voltage of the power transistor.

* * * * *